United States Patent [19]

Sakai et al.

[11] Patent Number: 4,727,318
[45] Date of Patent: Feb. 23, 1988

[54] APPARATUS FOR MEASURING CHARACTERISTICS OF ELECTRONIC DEVICES

[75] Inventors: Ryoichi Sakai, Kanagawa; Hisashi Tamamura, Tokyo, both of Japan

[73] Assignee: Sony/Tektronix Corporation, Tokyo, Japan

[21] Appl. No.: 780,957

[22] Filed: Sep. 27, 1985

[30] Foreign Application Priority Data

| Oct. 4, 1984 | [JP] | Japan | 59-208791 |
| Oct. 4, 1984 | [JP] | Japan | 59-208792 |
| Oct. 26, 1984 | [JP] | Japan | 59-225553 |
| Dec. 5, 1984 | [JP] | Japan | 59-257196 |

[51] Int. Cl.$^4$ .................................. G01R 31/22
[52] U.S. Cl. ....................... 324/158 T; 324/158 D; 324/158 R
[58] Field of Search ............ 324/158 T, 158 D, 73 R, 324/158 R; 331/21, 25, 71; 328/155; 323/211

[56] References Cited

U.S. PATENT DOCUMENTS

| 2,577,803 | 12/1951 | Pfann | 324/158 T |
| 2,980,853 | 4/1961 | Kline et al. | 324/158 T X |
| 3,054,954 | 9/1962 | Boscia et al. | 324/158 T |
| 4,023,116 | 5/1977 | Alfke et al. | 328/155 X |
| 4,290,028 | 9/1981 | Legrand | 331/25 X |
| 4,456,880 | 6/1984 | Warner et al. | 324/158 T X |
| 4,484,158 | 11/1984 | Pavin | 328/155 X |
| 4,500,853 | 2/1985 | Stifter | 331/21 X |
| 4,635,000 | 1/1987 | Swanberg | 331/25 X |

FOREIGN PATENT DOCUMENTS 0197015 10/1985 Japan ........................... 331/21

Primary Examiner—Reinhard J. Eisenzopf
Assistant Examiner—Vihn P. Nguyen
Attorney, Agent, or Firm—Dellett, Smith-Hill & Bedell

[57] ABSTRACT

An electronic device measurement apparatus measures a characteristic of an electronic device under test (DUT) by applying a sine-wave voltage to the DUT, detecting the voltage across the DUT as well as the current flowing through the DUT and displaying a characteristic curve in accordance with the detected voltage and current. The sine-wave voltage is generated in phase with an AC line voltage but the amplitude thereof is independent of the line voltage, and consequently the circuits in the measurement apparatus are not affected by variations in phase and amplitude in the line. Moreover, the generated sine-wave voltage is symmetrical, whereby display distortion is substantially eliminated. A voltage limiter and a current limiter are provided for limiting the voltage and current to be applied to the DUT to values determined by a display window, for protecting a current detecting resistor and a voltage divider connected to the DUT.

18 Claims, 13 Drawing Figures

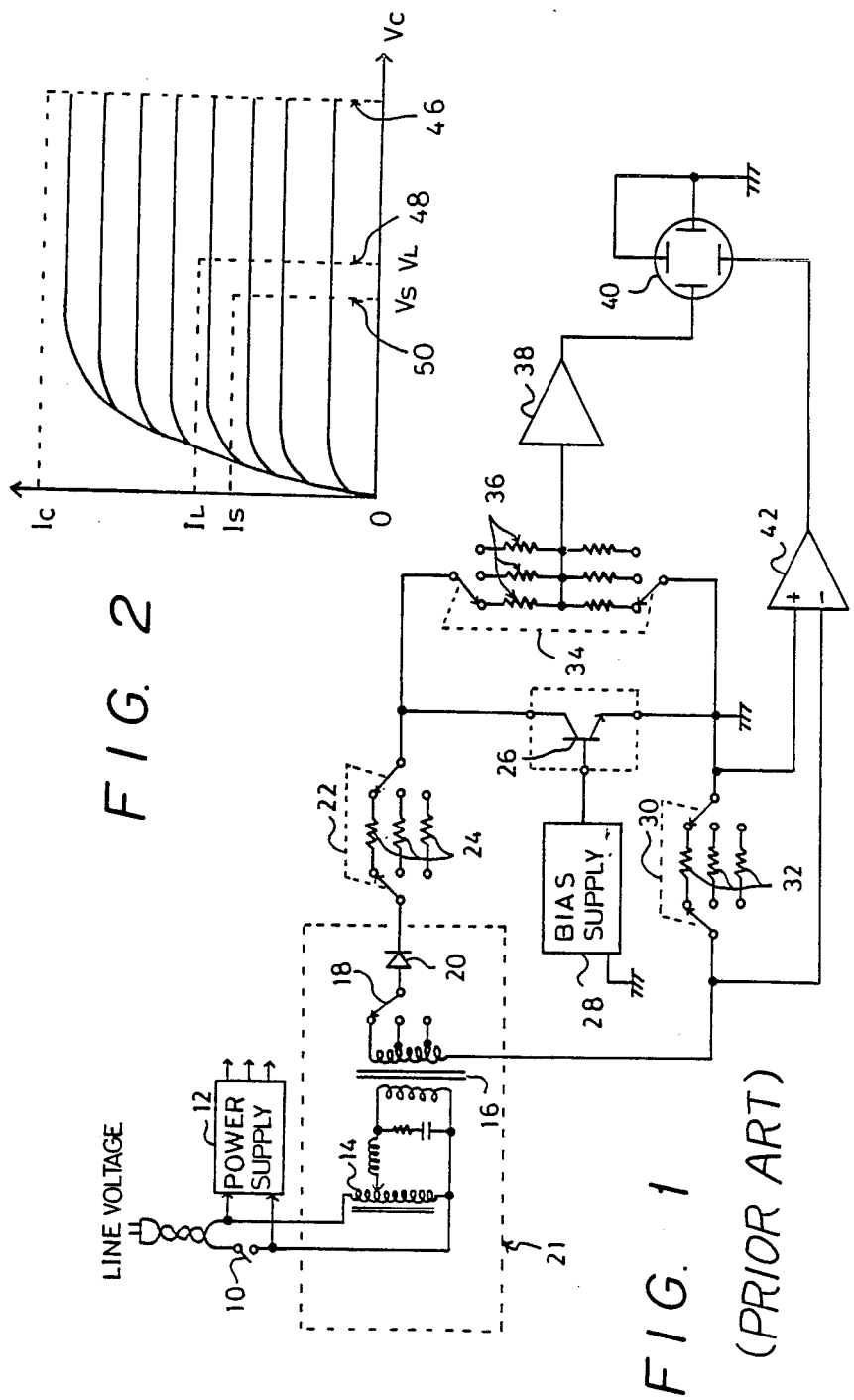

APPARATUS FOR MEASURING CHARACTERISTICS OF ELECTRONIC DEVICES

BACKGROUND OF THE INVENTION

The present invention relates to an apparatus for measuring the characteristics of electronic devices, such as transistors, diodes, etc.

An electronic device measurement apparatus, generally known as a curve tracer, is useful to measure characteristics of electronic devices such as transistors, diodes, etc. A conventional electronic device measurement apparatus of this type is illustrated in FIG. 1, wherein an AC voltage from a line source is applied through a switch 10 to power supply circuit 12 as well as to variable transformer 14. The power supply circuit 12 produces DC voltages for each circuit of the measurement apparatus, while the variable transformer 14 supplies an AC voltage having a controlled amplitude to a primary winding of transformer 16. A plurality of taps are provided on the secondary winding of the transformer 16, and one of these taps, excluding the lowest position tap, is selected by a switch 18 for connection to the anode of diode 20 which half-wave rectifies the selected AC voltage. The elements 14–20 provide a collector supply circuit 21. The cathode voltage of diode 20 is applied to a first terminal of a device under test (DUT), e.g., to the collector of a transistor 26 through a load resistor 24 selected by a switch 22. The base of the transistor 26 receives a stepped bias signal from a bias supply circuit 28, while the emitter thereof, comprising a second terminal of the DUT, is grounded. The lowest tap of transformer 16 is connected to the emitter of the transistor 26 through a collector current detector resistor 32 as selected by a switch 30. Furthermore, a voltage divider 36 is selected by switch 34 and divides down the collector voltage Vc of the transistor 26 for application to a horizontal deflection plate of cathode ray tube (CRT) 40 via an amplifier 38 having a high input impedance. Differential amplifier 42 operates as a high input impedance voltage detector which detects a voltage across a resistor 32 (being substantially proportional to the collector current Ic) and couples this voltage to a vertical deflection plate of CRT 40. The CRT 40 displays the Vc-Ic characteristic curve of the transistor 26 as shown in FIG. 2, as the voltage thereacross is varied in response to half cycles of line voltage. In FIG. 1, the DUT 26 comprises a common emitter connected transistor. However, another electrode of the transistor may be grounded, or the DUT may comprise another electronic device such as a diode. In any case, the voltage-current characteristic of the DUT is displayed on CRT 40.

The conventional measurement apparatus as shown in FIG. 1 has many disadvantages. For example, the collector supply circuit consisting of elements 14–20 uses the external line voltage directly, the line voltage waveform desirably comprising a sine-wave. It should be noted, however, that a pure sine-wave consists of only one frequency component while the waveform of the external line voltage is not a pure sine-wave, i.e., it is not a symmetrically repeated waveform, but rather includes various distortions. In other words, the repeated voltage waveform applied to the DUT, not being a pure sine-wave, is not symmetrical but rather contains differing frequency components, and it is found a forward trace of the characteristic curve displayed on the CRT 40 (during a rising period of the rectified sine-wave voltage) is different from a back trace thereof (during a falling period of the rectified sine-wave voltage). Therefore, the characteristic of the DUT cannot be measured exactly, but a phenomenon occurs called display distortion in this specification. Moreover, the peak amplitude of the line voltage is not constant but varies within a predetermined range. As a result of the variation, the peak amplitude of the repeat waveform voltage applied to the DUT varies in response to the line voltage, producing further inaccuracies in measurement.

If a digital storage circuit is added to the measurement apparatus shown in FIG. 1, by inserting additional circuits between the amplifier 38 and the CRT 40 and between the amplifier 42 and the CRT 40, with each of the additional circuits consisting of an analog-to-digital converter, a digital memory and a digital-to-analog converter, the output from the analog-to-digital converters may be affected by ripple of the power supply circuit 12 since the clock frequency for the analog-to-digital converters is independent of line voltage frequency. Therefore measurement accuracy is further reduced. For synchronizing the clock frequency of an analog-to-digital converter with the line frequency, an additional phase control circuit would be needed, resulting in additional expense in the measurement apparatus.

It should also be noted that switches 30 and 34 are controlled in accordance with the desired measurement range. Thus, horizontal-axis "size" of the display is determined by the dividing ratio of the voltage divider 36 selected by switch 34 and the vertical-axis "size" is determined by the value of the resistor 32 selected by switch 30. The maximum voltage to be applied to the DUT, or the measurement range, is determined by the adjustment of the variable transformer 14 and the selection of switch 18. It will be seen it is necessary to select a resistor 32 having a small value when measuring a large current flowing through the DUT, and it is necessary to select a voltage divider 36 having a large dividing ratio when measuring a large voltage across the DUT.

When the switches 30 and 34 select a resistor 32 of small value and a voltage divider 36 of large dividing ratio respectively, the CRT 40 may, for example, be able to display a characteristic curve within a window defined by dotted line 46 shown in FIG. 2. If the output amplitude of the variable transformer 14 is adjusted to be relatively large, the characteristic curve may be displayed on all of the screen area of the CRT 40. In this instance, the selected resistor 32 and the resistors of the selected voltage divider 36 should be resistors which can withstand a large current and a high voltage. When the switches 30 and 34 select respectively a resistor 32 of higher value and a voltage divider 36 of smaller dividing ratio, a display window of the CRT 40 is selected which may be limited within a window defined by a dotted line 50 shown in FIG. 2. Thus, for a given current through a larger resistor 32, larger voltages are generated thereacross and less of the characteristic may be viewed on the CRT. When the operator wants to measure the DUT only within the window 50, the resistor 32 and the resistors of the voltage divider 36 can be resistors appropriate to withstand a relatively small current and a relatively small voltage. Thus, the voltage and current applied to the DUT from transformer 14 need not be as high. However, it is still possible to apply high voltage and current to the DUT within a range of values larger than window 50, e.g., within window 46, by adjusting variable transformer 14. Therefore, the conventional measurement apparatus must utilize resistors which can withstand a high voltage and a high current for all the resistors 32 as well as for all resistors of the voltage dividers 36. If relays are used for switches 30 and 34, all the relays must be able to withstand high voltages and large currents. Resistors and relays satisfying these requirements are large and expensive in construction. Moreover, the DUT may receive unnecessarily high voltages and currents. It should also be noted that even though the variable transformer 14 is further adjusted to increase the voltage and current to the DUT to points in the window 46 as noted above, the CRT 40 will ordinarily display the characteristic curve only within window 50 and not outside thereof because the values of the resistor 32 and the voltage divider 36 are suitably employed to determine display sensitivity, and the display area of the CRT 40 is limited.

As described hereinbefore, the voltage divider 36 is utilized in adjusting the measurement range. As a result, the current flowing through the selected resistor 32 is the sum of the collector current of transistor 26 and the current flowing through voltage divider 36. It should be further noted that the base current of the transistor 26 flows through ground to the bias supply circuit 28 and does not flow through resistor 32, because the output current value of the collector supply circuit 21 (at the cathode of diode 20) is equal to the input current value thereof (at the lowest position terminal of transformer 16). In any case, the voltage across the resistor 32 is not directly proportional to the collector current of transistor 26 and this leads to error in the measurement result.

The above-described disadvantages of the conventional measurement apparatus are summarized as follows:

1. Since the line voltage is applied to the DUT through a transformer, the displayed characteristic curve is distorted, and the ripple of the power supply circuit affects the accuracy of an analog-to-digital converter if one is used.

2. The collector current detecting resistors, the voltage dividers and the switches must withstand high voltage and large currents regardless of the measurement range.

3. The current flowing through the DUT is not detected accurately because of a voltage divider shunted thereacross.

SUMMARY OF THE INVENTION

A measurement apparatus according to the present invention overcomes the aforementioned disadvantages of the prior art. For overcoming the first disadvantage, the measurement apparatus of the present invention comprises a pulse generating means for generating a pulse in synchronism with the line AC voltage, the pulse frequency being higher than the line frequency, a frequency divider for dividing the frequency of the output pulse from the pulse generating means, a repeat waveform generator for generating a repeat waveform voltage in phase with the line voltage in response to the output pulses from the frequency divider, voltage supply means for supplying the repeat waveform voltage from the repeat waveform generator to a DUT, and a display means for displaying a characteristic curve in response to a voltage across the DUT and current flowing through the DUT. Since the repeat waveform generator regenerates the repeat waveform voltage, in the manner of a sine-wave voltage, this voltage waveform is symmetrical and does not include a distortion component as compared with the line voltage waveform. Thus, the display distortion can be substantially avoided. The regenerated repeat waveform voltage is independent of the line voltage, so that the repeat waveform voltage is not affected by the peak voltage variation of the line voltage and a correct measurement will be accomplished. Since the repeat waveform voltage from the repeat waveform generator is in phase with the line voltage because of the pulse generating means and frequency divider, each circuit receiving the repeat waveform voltage is unaffected by ripple, phase variation, etc. of the line voltage.

The measurement apparatus of this invention further suitably includes an analog-to-digital converter means for converting the voltage across the DUT and the current flowing through the DUT into digital signals in response to the output pulse from the pulse generating means or the frequency divider, and a memory circuit for storing the digital output signals from the analog-to-digital converter means. In this instance, the analog-to-digital converter means is not affected by the variation of the line voltage because such means samples the voltage and current of the DUT in synchronism with the line voltage. Moreover, the output signals from the pulse generating means and the frequency divider can be used for both the repeat waveform generator and the analog-to-the digital converter, so that the measurement apparatus becomes simple and inexpensive in construction.

For overcoming the second disadvantage of the prior art, the measurement apparatus of this invention supplies a variable voltage to the DUT, detects the voltage across the DUT and the current flowing through the DUT, and limits the voltage and the current to predetermined values of the display window with a voltage limiter means and a current limiter means when displaying the voltage-current characteristic of the DUT on the display means. Even if the operator wants to apply a voltage larger than the display window to the DUT, the voltage limiter limits the voltage to a value determined by the display window and the limited voltage is applied to the DUT. Moreover, if the operator wants to apply a current larger than the display window value, the current limiter limits the current to a value determined by the display window and the limited current flows through the DUT. If the window is as small as the display window 50 of FIG. 2, the current detecting resistor, the resistors of the voltage divider and the switches, need withstand only low voltage and small current. Thus, the apparatus becomes inexpensive and simple in construction. This advantage becomes more and more conspicuous if the number of current detecting resistors and resistors in the voltage divider increases. Moreover, the DUT does not receive unnecessarily high voltage and high current. It should be noted that there is no problem when the voltage and current are limited, because the characteristic beyond the limited values is not displayed on the display means.

For overcoming the third disadvantage of the prior art, the measurement apparatus of this invention comprises a power supply for applying a voltage between first and second terminals of the DUT, a current detecting resistor connected between the power supply and the second terminal of the DUT, a voltage divider connected between the power supply side of the current detecting resistor and the first terminal of the DUT, a first buffer amplifier with its input terminal connected to the output terminal of the voltage divider, a second buffer amplifier with an input terminal connected to the second terminal of the DUT, a third buffer amplifier with an input terminal connected to the power supply side of the current detecting resistor and an operational circuit for receiving the signals from the first, second and third buffer amplifiers. Since the voltage divider for dividing the voltage between the first and second terminals of the DUT is not connected to the common junction of the second terminal of the DUT and the current detecting resistor and the input impedances of the buffer amplifiers are very high, only the current flowing between the first and second terminals of the DUT flows through the current detecting resistor and this current can be detected accurately. As a result of the fact that the first buffer amplifier receives the first terminal voltage divided by the voltage divider, this first buffer amplifier does not receive the high voltage and need not be floated. When the voltage divider divides the voltage between the first and second terminals of the DUT, an error voltage occurs because of the voltage across the current detecting resistor. This error voltage is compensated by applying the output signals from the first, second and third buffer amplifiers to the operational circuit. The second buffer amplifier prevents the current at the second terminal of the DUT from flowing into the operational circuit, and the third buffer amplifier prevents current from flowing from the power voltage source of the second buffer amplifier through the output terminal thereof and the operational circuit to the power voltage source of the DUT. Thus, the measurement can be accomplished accurately.

It is, therefore, an object of the present invention to provide an improved apparatus which measures characteristics of electronic devices accurately.

It is another object of the present invention to provide an improved electronic device measurement apparatus which can eliminate distortion from a displayed characteristic curve of a DUT.

It is a further object of the present invention to provide an improved electronic device measurement apparatus which eliminates effects of a line voltage on a digitizing circuit of the apparatus.

It is an additional object of the present invention to provide an improved repeat waveform generator which generates a symmetrical and stable waveform voltage.

It is another object of the present invention to provide an improved electronic device measurement apparatus which includes voltage and current control circuits for inhibiting application of unnecessarily high voltage and large current to a current detecting resistor, a voltage divider, switches and a DUT.

It is a further object of the present invention to provide an improved electronic device measurement apparatus which accurately detects a current flowing to a DUT regardless of a voltage divider connected across the DUT.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a block diagram of a conventional electronic device measurement apparatus;

FIG. 2 comprises characteristic curves of a transistor under test displayed by an electronic device measurement apparatus;

Figure 5A:
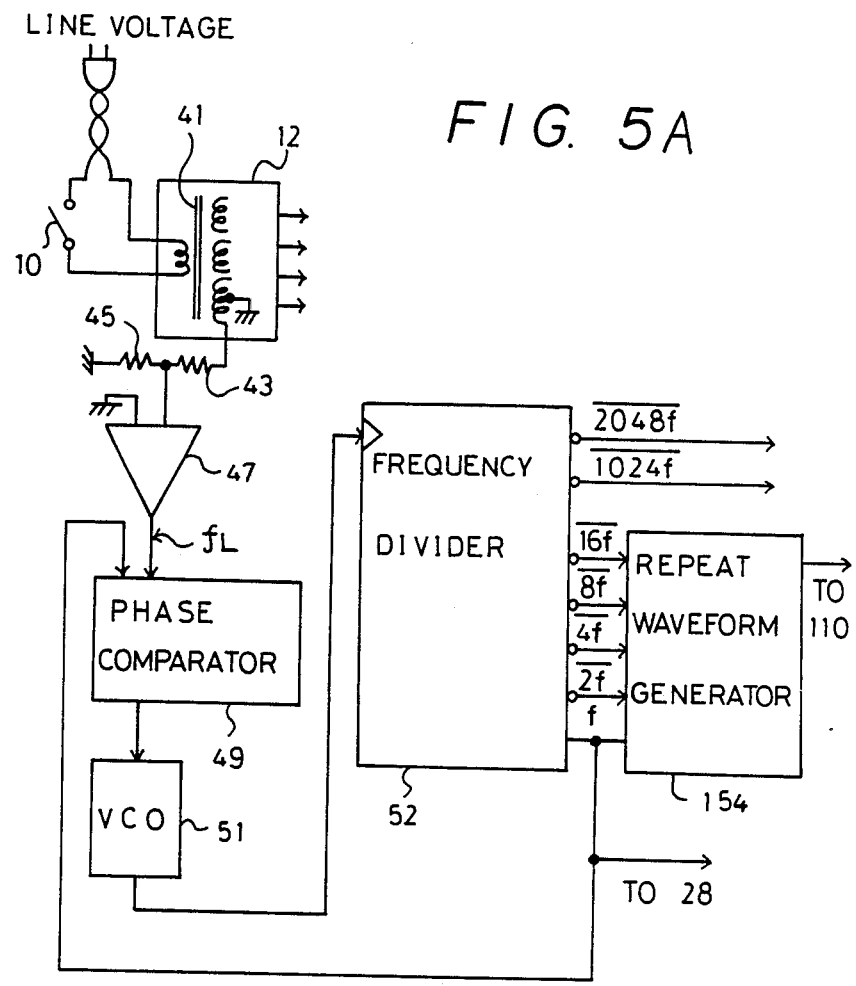
Figure 5B:
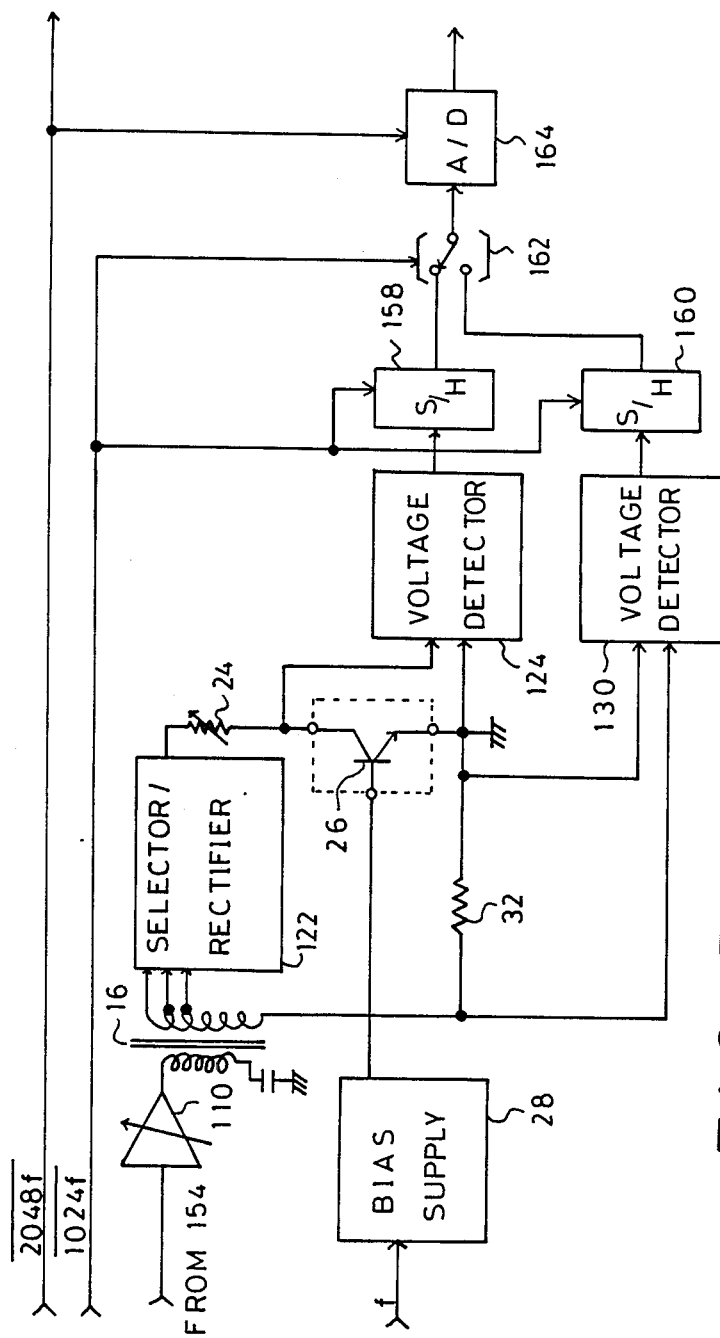
Figure 6:
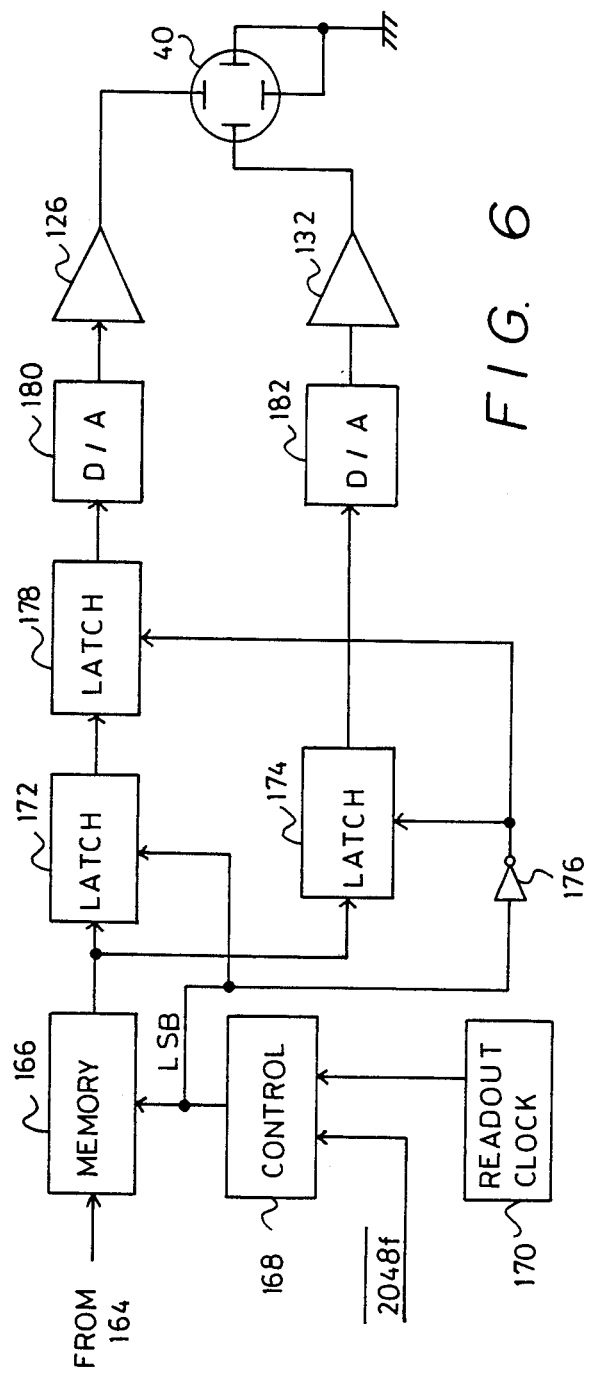
Figure 7A:
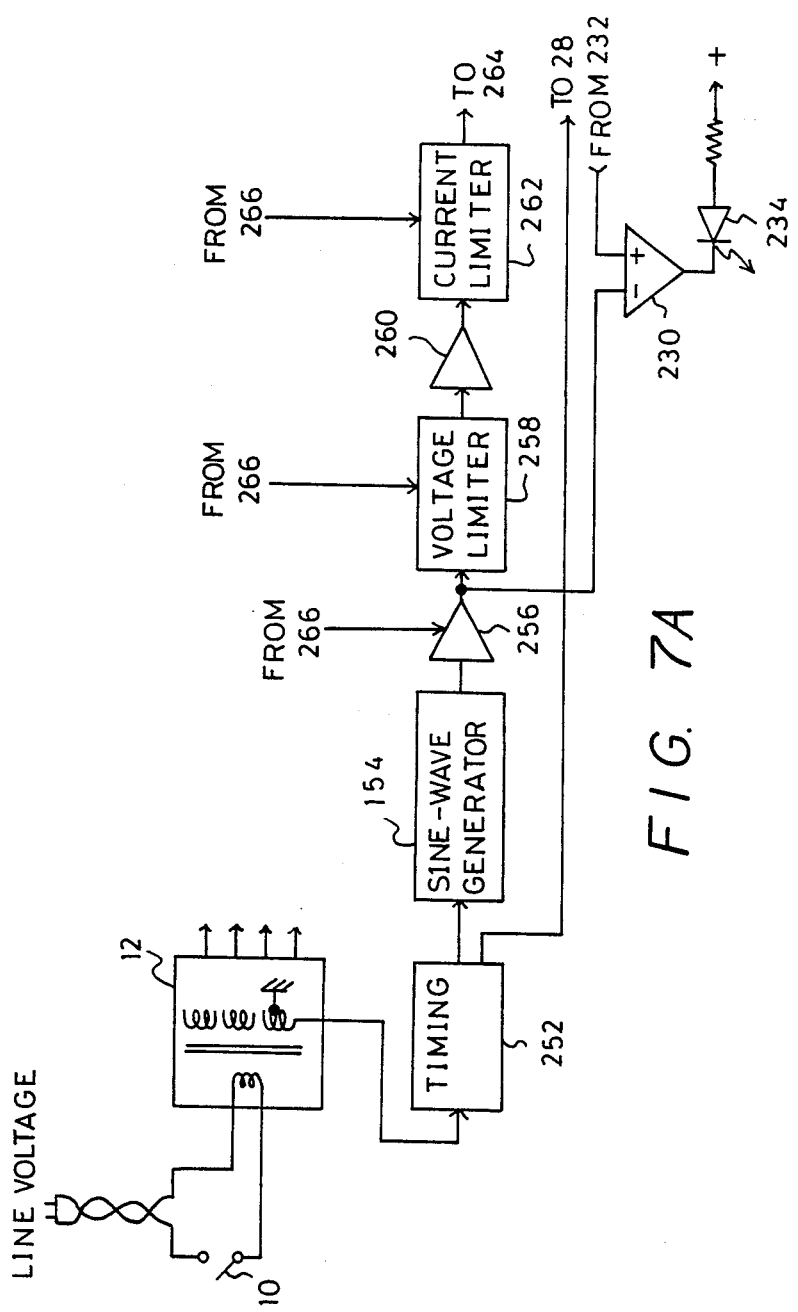
Figure 7B:
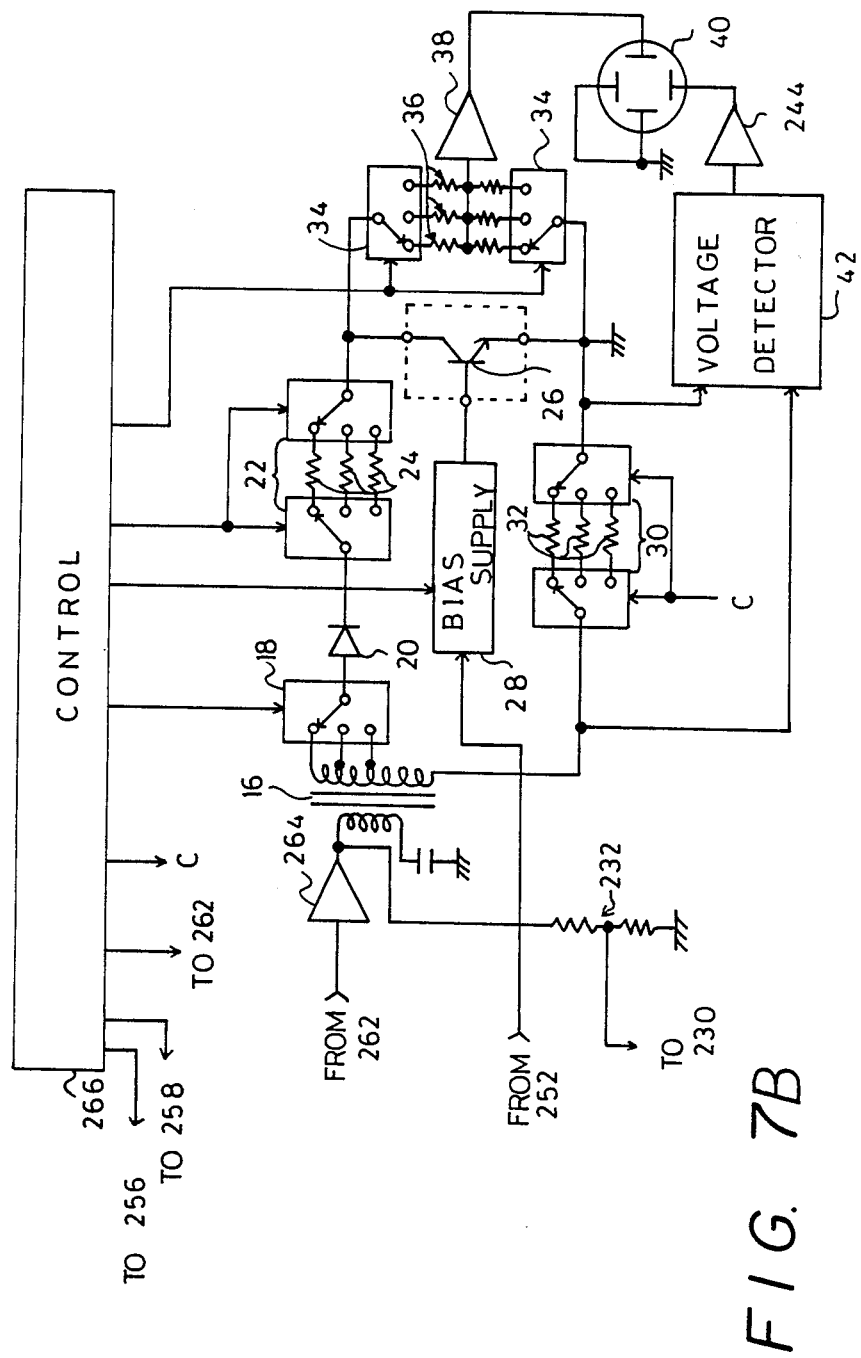
Figure 8:
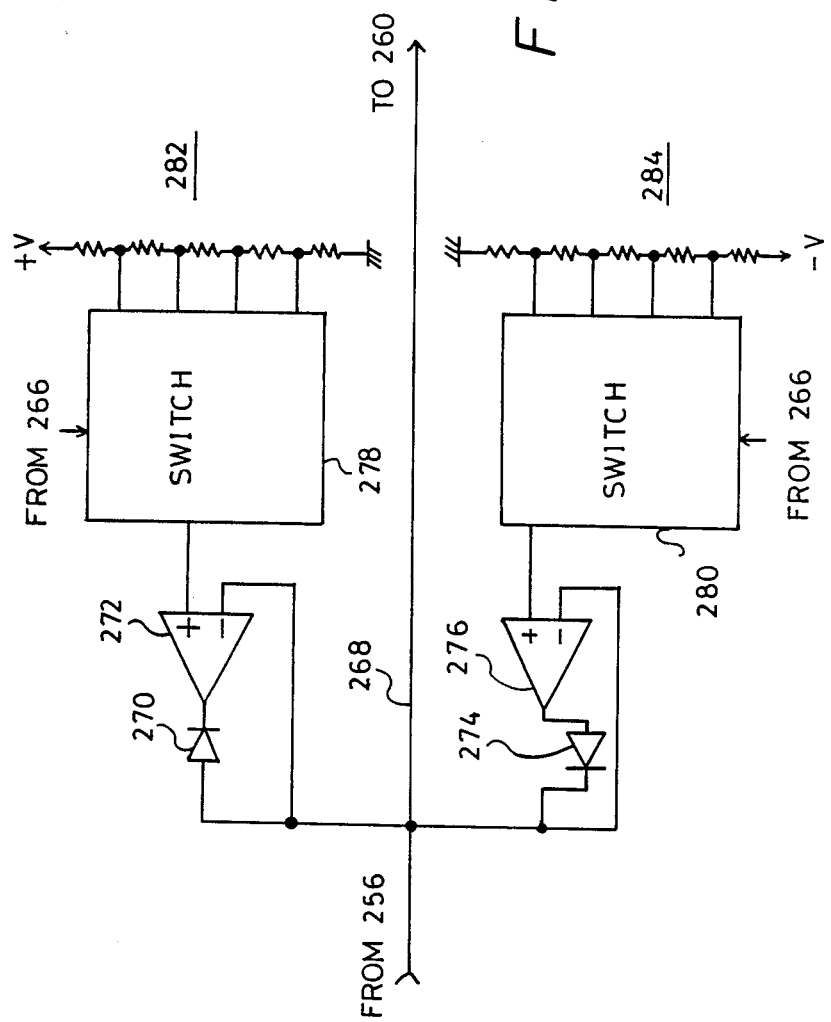
Figure 9:
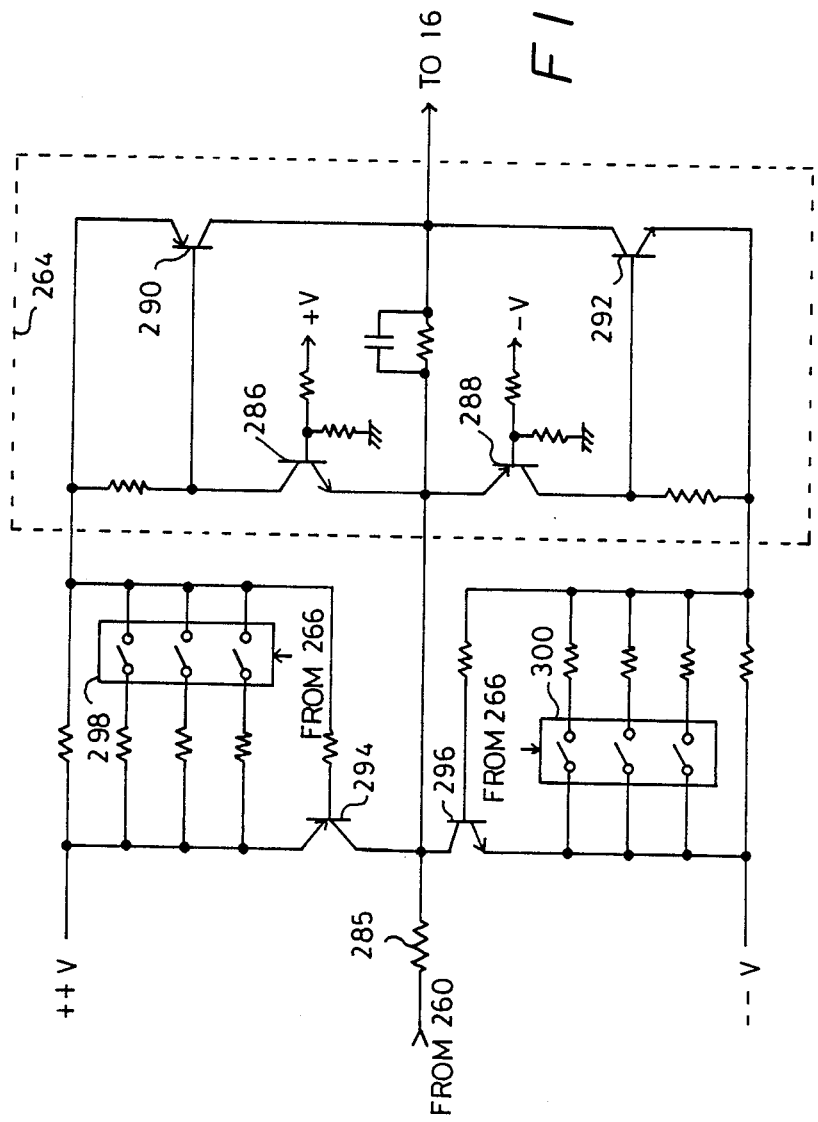
Figure 10:
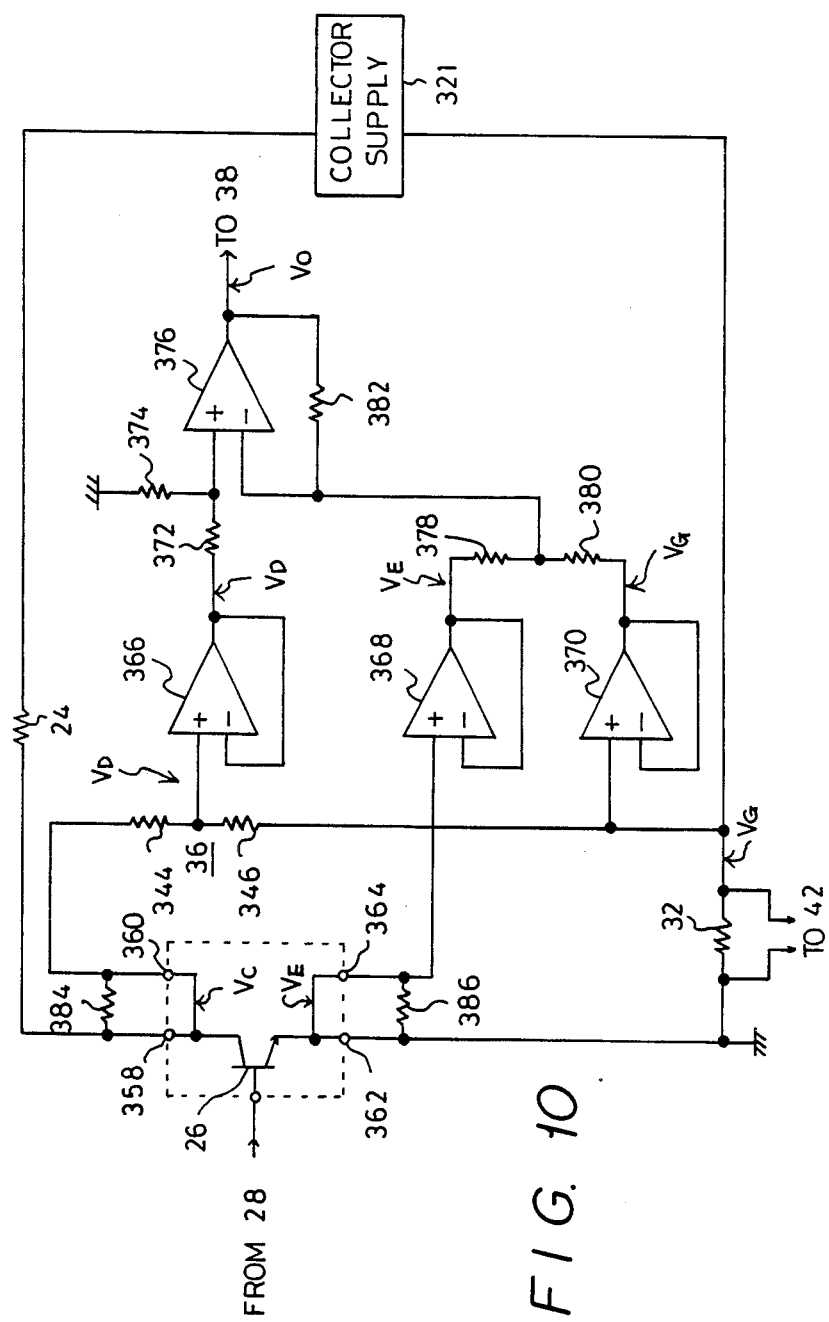

FIG. 5A comprises a block diagram of a part of a second preferred embodiment according to the present invention wherein the first embodiment is applied to an electronic device measurement apparatus having a digital storage function;

FIG. 5B comprises a block diagram of another part of said second embodiment;

FIG. 6 is a block diagram of another part of the second embodiment according to the present invention;

FIG. 7A illustrates a block diagram of a part of a third preferred embodiment according to the present invention wherein voltage and current limiters are applied to the first embodiment of the present invention;

FIG. 7B illustrates a block diagram of another part of said third embodiment;

FIG. 8 is a circuit diagram of a voltage limiter used in the third embodiment of the present invention as shown in FIGS. 7A and 7B;

FIG. 9 is a circuit diagram of a current limiter used in the third embodiment of the present invention as shown in FIGS. 7A and 7B; and FIG. 10 comprises a circuit diagram of a voltage detector circuit used in the present invention.

DETAILED DESCRIPTION OF THE INVENTION

Figure 3A:
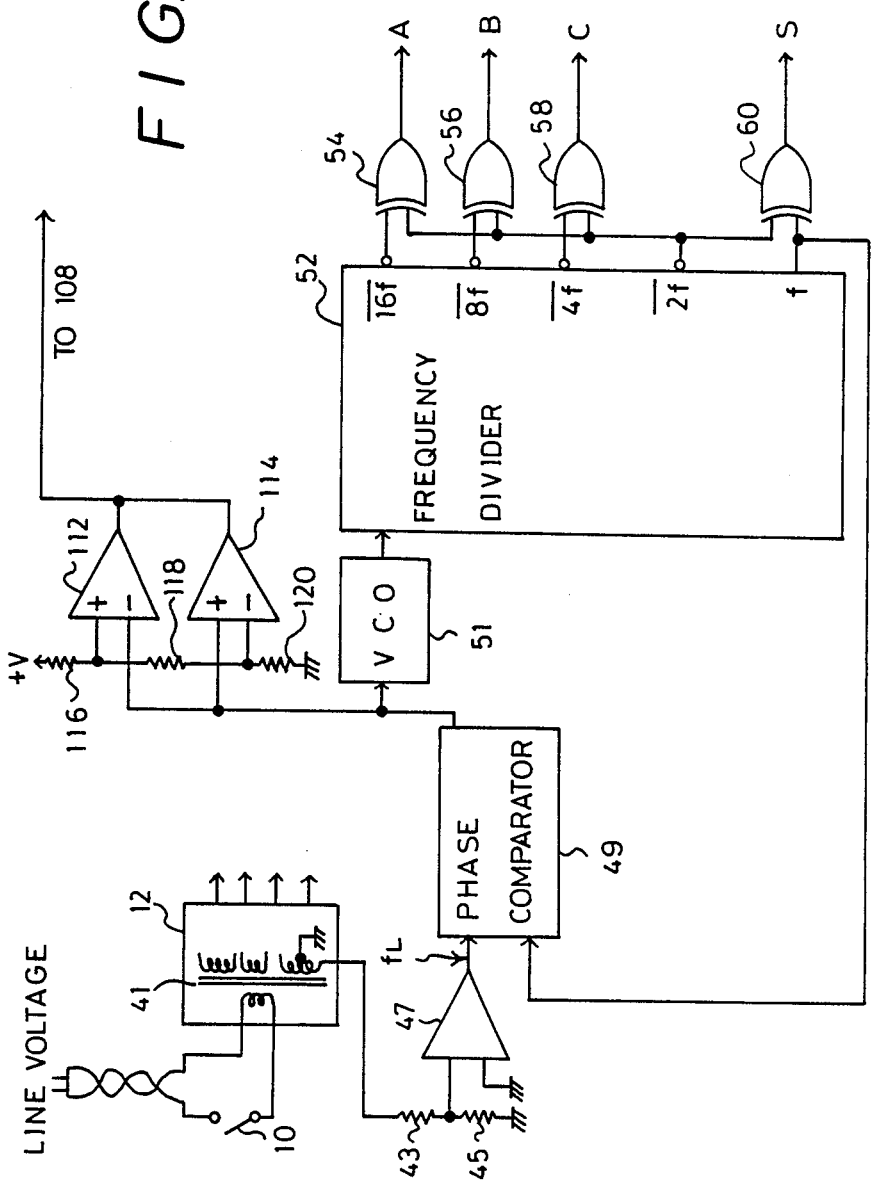
FIG. 3A is a circuit diagram of a part of a first preferred embodiment according to the present invention for illustrating a repeat waveform voltage generator employed therein.
Figure 3B:
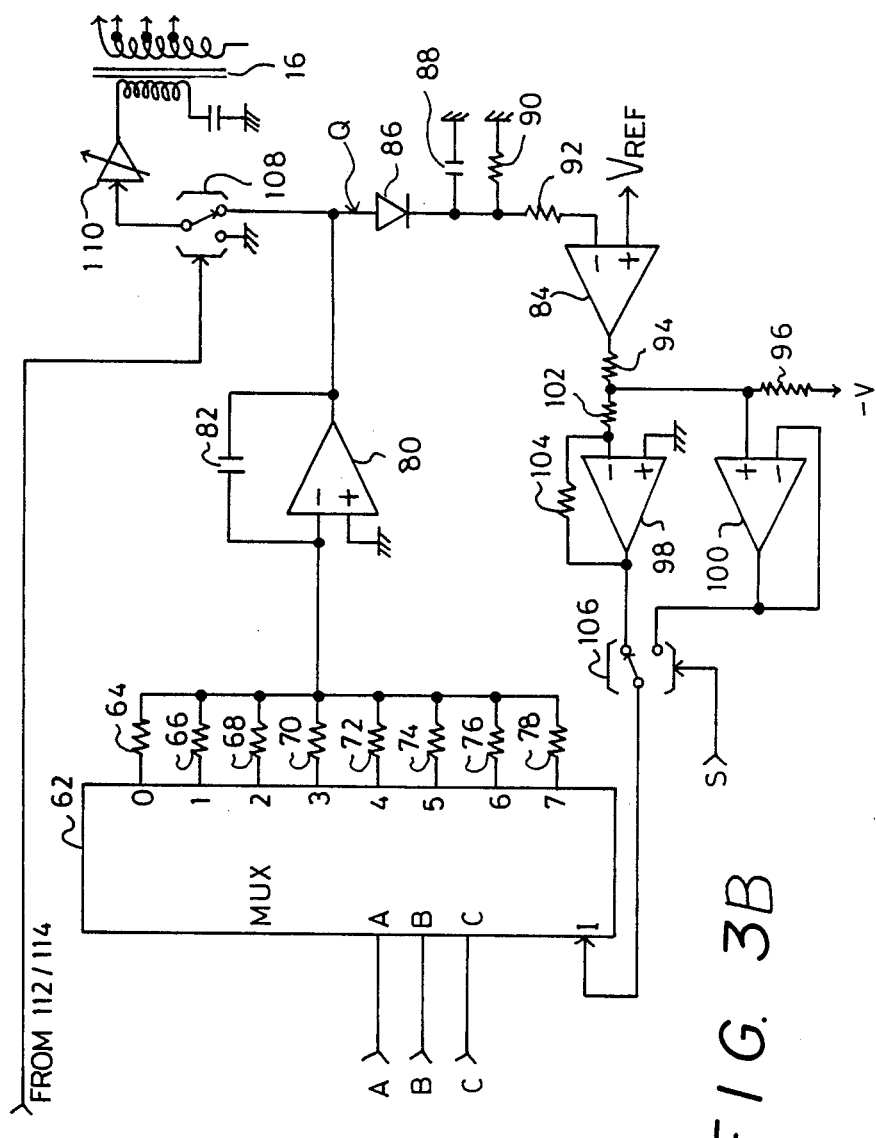
FIG. 3B is a circuit diagram of another part of said first embodiment.

Referring to FIGS. 3A and 3B (hereinafter jointly referred to as FIG. 3) there is shown a circuit diagram of a part of a first preferred embodiment according to the present invention. An AC line voltage is applied through a power switch 10 to a primary winding of a transformer 41 provided in a power supply circuit 12. A plurality of secondary windings of transformer 41 are connected to DC voltage regulator circuits (not shown) of the power supply circuit 12 for generating regulated DC voltages for each of circuits in the electronic device measurement apparatus. An AC voltage across the lowest position secondary winding of the transformer 41 is divided by resistors 43 and 45. A voltage comparator 47 compares the divided AC voltage with ground voltage for generating a pulse signal $f_L$ whose level is inverted every time the line voltage crosses ground voltage. It should be noted that this pulse signal $f_L$ is a reference signal having the same frequency and phase as the line voltage.

An oscillation frequency of a variable frequency oscillator (voltage controlled oscillator or VCO) 51 is $2^n$ (n is a positive integer) times the frequency of pulse signal $f_L$, e.g., $4096(=2^{12})$ times the pulse signal $f_L$. An output signal ($4096\,f_L$) from the VCO 51 is applied to a clock terminal of a counter 52 operating as a frequency divider. The frequency divider 52 divides the frequency of the output signal from the VCO 51 so as to generate signals $\overline{16f}$, $\overline{8f}$, $\overline{4f}$, $\overline{2f}$ and f whose frequencies are sixteen, eight, four, two and one times the pulse signal $f_L$, respectively. Bars over "$\overline{16f}$", "$\overline{8f}$", "$\overline{4f}$" and "$\overline{2f}$" represent that the signals are inverted in phase with respect to the input signal to the frequency divider 52. A phase comparator 49 compares the phase of the pulse signal $f_L$ with that of the output pulse signal f from the frequency divider 52 and controls the oscillation frequency of the VCO 51 such that the phase of the pulse signals $f_L$ and f are equal to each other. Thus, a phase locked loop consists of phase comparator 49, VCO 51 and frequency divider 52, and each of the output pulses from the frequency divider 52 is synchronized with the AC line voltage.

An encoder circuit for encoding the output pulses from the frequency divider 52 includes four exclusive OR (XOR) gates 54–60, wherein XOR gate 54 receives the pulse signals $\overline{16f}$ and $\overline{2f}$, XOR gate 56 receives the pulse signals $\overline{8f}$ and $\overline{2f}$, XOR gate 58 receives the pulse signals $\overline{4f}$ and $\overline{2f}$, and XOR gate 60 receives the pulse signals $\overline{2f}$ and f. Thus, the phase of the output pulse signal S from XOR gate 60 is delayed by ninety degrees with respect to the pulse signal f, namely, $f_L$, and the output pulses A-C construct a three-bit digital signal changing sequentially from "000" to "111" and from "111" to "000" every ninety degrees (a quarter period) of the pulse signal S. The phase relation of these signals is shown in FIG. 4.

An analog multiplexer (MUX) 62 as a first selector means connects an input terminal I to one of the output terminals 0–7 selectively in response to the digital signal A-C from the XOR gates 54–58. The output terminal 0 is selected when the signals at the selection terminals A-C are "000", the output terminal 1 is selected when the signals are "001", and the output terminal 2 is selected when the signals are "010". Similarly, the output terminals 3, 4, 5, 6 and 7 are selected respectively by "011", "100", "101", "110" and "111". The output terminals 0–7 of the multiplexer 62 are respectively connected to first terminals of resistors 64–78 with the other end terminals being connected to an input terminal of an integrator. This integrator comprises an operational amplifier 80 having a grounded non-inverting input terminal and a capacitor 82 connected between an inverting input terminal and an output terminal of the operational amplifier. Thus, the integrator comprises a Miller integrator whose input resistor is one of the resistors 64–78 selected by multiplexer 62. By way of example, the values of the resistors 64–78 are respectively 15.0 K-ohms, 16.9 K-ohms, 19.1 K-ohms, 23.7 K-ohms, 31.6 K-ohms, 51.1 K-ohms and 154 K-ohms, while the value of the capacitor 82 is 0.1 $\mu$F. This selection of values provides approximately a sine-wave output, but clearly other values of similar ratio will simulate a sine-wave or other symmetrical wave.

An output signal Q from the integrator is applied through a peak value detector to a voltage comparator 84. This peak detector consists of a diode 86, capacitor 88, and resistors 90 and 92. The voltage comparator 84 compares the peak value of the output signal Q from the integrator with a reference voltage $V_{REF}$, and a difference output voltage therefrom is divided by resistors 94 and 96 and applied to an inverting amplifier 98 and a non-inverting amplifier 100. Values of input resistor 102 and feedback resistor 104 are equal to each other. Output voltages from the amplifiers 98 and 100 are applied to the input terminal I of the multiplexer 62 through an electronic switch 106 as a second selection means which is controlled by the pulse signal S. The circuit elements 54–82 and 106 comprise a converter means.

Figure 4:
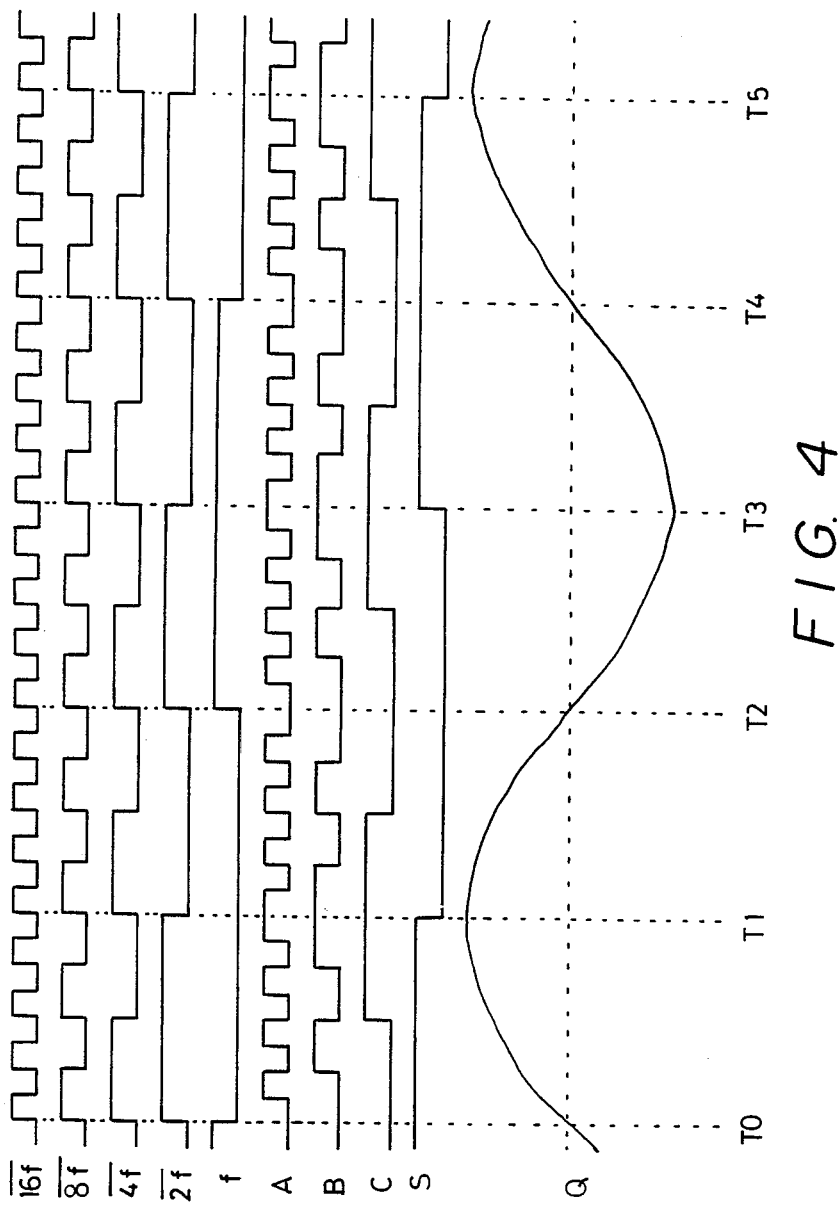
FIG. 4 depicts a time chart for explaining operation of the repeat waveform voltage generator shown in FIG. 3.

As shown in FIG. 4, the switch 106 applies the output signal from the non-inverting amplifier 100 to the input terminal I of the multiplexer 62 during the first quarter of the period between times $T_0$ and $T_1$. Since this first quarter of the period is equally divided by eight and the resistors 64–78 are selected in sequence in accordance with the pulse signals A–C, the output signal Q from the integrator is a quarter of a sine-wave. In a term between times $T_1$ and $T_2$, the output voltage from the inverting amplifier 98 is applied to the input terminal I of the multiplexer 62. This term is divided by eight and the resistors 78–64 are selected in sequence. The circuit operates similarly as described hereinbefore and the output signal Q of the integrator can be a repeat sine-wave like voltage which is in phase with the line frequency signal. Since the input voltage to the integrator is controlled by the peak detector 86–92 and voltage comparator 84 so as to maintain the peak amplitude of the sine-wave voltage Q constant, this amplitude is not affected by the variation of the line voltage frequency and amplitude.

The output voltage Q from the integrator is applied to the primary winding of the transformer 16 through an electronic switch 108 and a variable gain amplifier (including a low pass filter for eliminating harmonic distortion) 110. The secondary winding circuit of transformer 16 may be the same as shown in FIG. 1. In the circuit of FIG. 3, comparators 112 and 114 compare the output voltage from the phase comparator 49 with reference voltage divided by resistors 116–120. In other words, the comparator 112 determines whether the output voltage from the phase comparator 49 is lower than a predetermined upper limit voltage or not, and the comparator 114 determines whether or not the output voltage from the phase comparator 49 is higher than a predetermined lower limit voltage. When the output voltage from the phase comparator 49 is equal to or higher than the predetermined lower limit voltage and equal to or lower than the predetermined upper limit voltage, the switch 108 selects the amplifier 80. In the other instance, the switch 108 selects ground. Thus, when the phase difference between the sine-wave voltage Q generated by the converter means and the line voltage is larger than a predetermined value, the sine-wave voltage Q is inhibited from being applied to the following stage for avoiding an incorrect measurement.

In the circuit of FIG. 3, the first stage of the voltage comparator 84 may be an average detector or an RMS (root-mean-square) detector instead of a peak detector. The inverting and non-inverting output signals from voltage comparator 84 may be applied directly to the switch 106. Moreover, one cycle of the sine-wave voltage Q may consist of more components than thirty-two components by increasing the number of resistors in the converter means and appropriately modifying the construction of the encoder circuit 54–60 and the multiplexer 62.

As will be understood from the foregoing discussion, the present invention can generate a sine-wave voltage having less distortion and predetermined amplitude in synchronism with the line voltage, regardless of the line voltage waveform. Thus, the invention can eliminate display distortion, is not affected by the line voltage ripple and can measure the electronic device accurately.

FIGS. 5A and 5B (hereinafter jointly referred to as FIG. 5) and FIG. 6 are block diagrams of a second embodiment according to the present invention wherein the circuit of FIG. 6 receives output signals from the circuit of FIG. 5 and the electronic device measurement apparatus consists of the circuits of FIGS. 5 and 6. In this second embodiment a digital storage function is applied to the first embodiment shown in FIG. 3.

Construction and operation of circuit elements and blocks 10, 12, 41, 43, 45, 47, 49, 51 and 52 are the same as the elements and blocks indicated by corresponding reference numbers in FIG. 3, but the frequency divider 52 further generates a pulse signal $\overline{2048f}$ having a half frequency of the output pulse from the VCO 51. A repeat waveform generator 154 corresponds to the generator consisting of the circuit elements 54 through 106 shown in FIG. 3. Thus, the repeat waveform generator 154 generates a "sine-wave" voltage having the same frequency and phase as the AC line voltage and constant amplitude regardless of the amplitude of the AC line voltage.

The approximate sine-wave voltage from the repeat waveform generator 154 is applied to the primary winding of transformer 16 through the variable gain amplifier 110 or an appropriate analog multiplier. The secondary winding side of the transformer 16 is similar to the prior art as shown in FIG. 1 wherein a selector/rectifier circuit 122 includes switch 18 and diode 20. The selector/rectifier circuit 122 selects one of the taps of the secondary winding and rectifies the sine-wave voltage from the selected tap. The rectified voltage from the selector/rectifier circuit 122 is applied through the limiter resistor 24 to the collector of the transistor 26 as the DUT. The transformer 16 and selector/rectifier circuit 122 act as a voltage supply means. The lowest position terminal of the secondary winding of the transformer 16 is connected through the current detecting resistor 32 to the grounded emitter of the transistor 26. The base of the transistor 26 receives a bias signal from the bias supply circuit 28 which changes as a step pulse to provide different bias values in synchronism with the output pulse f of frequency divider 52. The transistor 26 under test is connected as a common-emitter type to the electronic device measurement apparatus, namely, the curve tracer in FIG. 5; however, it may be connected as a common base type or a common collector type. A voltage detector circuit 124 having a high input impedance detects the collector-emitter voltage $V_{CE}$ of the transistor 26 and divides the detected voltage $V_{CE}$ by an appropriate factor. A voltage detector circuit 130 also having a high input impedance detects the voltage across the resistor 32 as a measure of the collector current Ic. The voltage detector circuit 124 may consist of a switch 34, voltage dividers 36 and buffer amplifier 38 as shown in FIG. 1, while the voltage detector circuit 130 may comprise the differential amplifier 42 shown in FIG. 1. However, the preferred voltage detector circuit 124 according to the present invention will be described hereinafter by reference to FIG. 10.

This embodiment of the present invention includes an analog-to-digital (A/D) converter means for converting the voltages detected by voltage detectors 124 and 130 into digital signals. It should be noted that the detector 130 detects a current by measuring a voltage. The A/D converter means may consist of sample/hold (S/H) circuits and an A/D converter. In particular, the sample/hold circuits 158 and 160 respectively sample the output voltages from voltage detectors 124 and 130 and hold the sampled voltages in response to output pulse $\overline{1024f}$ from the frequency divider 52. Since one period of the sine-wave voltage from the repeat waveform generator 154 is 1/f, the sample/hold circuits 158 and 160 sample 1024 points within the one period. An electronic switch 162 selects sample/hold circuits 158 and 160 alternately, every half period of the output pulse $\overline{1024f}$ from the frequency divider 52, and the output signal from the switch 162 is applied to A/D converter 164. Since the switch 162 selects the sample/hold circuits 158 and 160 alternately, the A/D converter 164 receives as a clock signal the output pulse $\overline{2048f}$ (having a frequency double that of pulse $\overline{1024f}$) from the frequency divider 52 and converts the analog voltages from the sample/hold circuit 158 and 160 alternately into digital signals. It should be noted that both the pulse $\overline{1024f}$ and $\overline{2048f}$ are synchronized with the AC line voltage.

The digital output signal from the A/D converter 164 is stored in a memory circuit 166 of FIG. 6 in accordance with an address signal from control circuit 168. Control circuit 168 controls a writing mode and a reading mode of memory circuit 166, generates a writing address signal in the writing mode by counting the output pulses $\overline{2048f}$ from the voltage divider 52 and generates a reading address signal in the reading mode by counting a clock signal from a readout clock generator 170. Thus, the output signal ($V_{CE}$) from the sample/hold circuit 158 is stored in, for example, odd address locations of the memory circuit 166, and the output signal (Ic) from the sample/hold circuit 160 is stored in, for example, even address locations in the writing mode. As described hereinbefore, the voltage applied to the DUT 26 is in phase with the AC line voltage but the amplitude and the waveform thereof are independent of the AC line voltage. In addition, the sample/hold circuits 158 and 160, the electronic switch 162 and the A/D converter 164 operate in synchronism with the AC line voltage. Consequently, the memory circuit 166 stores digital values representing the characteristics of the DUT without being affected by voltage and/or phase variations of the line voltage and the waveform thereof.

In the reading mode, a latch circuit 172 latches the contents of the even address locations of the memory circuit 166 sequentially in response to the LSB (Least Significant Bit) of the address signal, and a latch circuit 174 latches the contents of the odd address locations of the memory circuit 166 sequentially in response to the LSB of the address signal inverted by an inverter 176. Since a latch circuit 178 latches the contents of the latch circuit 172 simultaneously with the latch operation of the latch circuit 174, digital-to-analog (D/A) converters 180 and 182 simultaneously receive the digital value Ic of the latch circuit 178 and the digital value $V_{CE}$ of the latch circuit 174, respectively, and convert them into analog signals. These analog signals are applied to the vertical and horizontal deflection plates of CRT 40 through amplifiers 126 and 132 for displaying the Ic-$V_{CE}$ characteristic of the DUT 26. The digital signal read from the memory circuit 166 may also be applied to a computer or the like for processing.

FIGS. 7A and 7B (hereinafter jointly referred to as FIG. 7) comprise a block diagram of another embodiment according to the present invention, wherein voltage and current limiters are applied to the embodiment as shown in FIG. 3. As described hereinbefore, the power supply circuit 12 includes a power transformer and voltage regulators, and one of the secondary windings of the transformer is connected to a timing circuit 252 for generating the various timing pulses in synchronism with the AC line voltage. This timing circuit 252 corresponds to the circuit consisting of devices 43, 45, 47, 49 and 51 through 60 in FIG. 3. The sine-wave generator, or the repeat waveform generator, 154 corresponds to the generator consisting of devices 62 through 106 in FIG. 3 and generates the sine-wave voltage in response to the timing pulses from the timing circuit 252, the sine-wave voltage being in phase with the AC line voltage.

The sine-wave voltage from the sine-wave generator 154 is applied to the primary winding of transformer 16 through a variable gain amplifier 256, a limiter 258 acting as a voltage control means, buffer amplifier 160, a limiter 262 acting as a current control means and an amplifier 264 including a noise eliminating filter. A control circuit 266 controls the amplitude of the variable voltage output from the amplifier 256. A D/A converter may be used instead of the amplifier 256, wherein such D/A converter receives the output voltage from sine-wave generator 154 as a reference voltage and the control digital signal from the control circuit 266 as the digital input signal, with the analog output signal being applied to limiter 258. The switches 18, 22, 30 and 34 may comprise relays controlled by circuit 266. The control circuit 266 suitably changes the limit values of the voltage limiter 258 and the current limiter 262 in relation to the selections of switches 30 and 34, namely, in accordance with the selection of the display window, so that the limit values remain within or are limited to substantially the window voltage and current values. The bias supply circuit 28 generates a bias signal wherein the time of occurrence of steps in the bias signal is controlled by the timing circuit 252, while the amplitude of each step is controlled by control circuit 266. Thus, a family of characteristic curves for different bias values is generated. The control circuit 266 may comprise a microprocessor, memories, a keyboard, etc.

Assuming that the display window on the CRT 40 is defined as the display window 50 of FIG. 2, and the upper right hand position of the window 50 corresponds to the current Is and the voltage Vs, the control circuit 266 sets the limit values of voltage limiter 258 and current limiter 262 to the values $I_L$ and $V_L$, respectively, these limit values $I_L$ and $V_L$ suitably being slightly larger than Is and Vs, respectively. As a consequence, a voltage larger than $V_L$ is not applied to the DUT 26 and a current larger than $I_L$ is not allowed to flow through the DUT 26 even if the gain of the variable amplifier 256 is set to be very high. Thus for the display window 50, the resistor 30 as well as the voltage divider 36 and the relays (switches) 30 and 34 need to withstand only the voltage $V_L$ and the current $I_L$, and it is not necessary that they be able to cover the whole measurement range. It will also be observed that an unncessarily large voltage and current will not be applied to the DUT 26. The limit values ($V_L$, $I_L$) of voltage limiter 258 and current limiter 262 are suitably set to be slightly larger than the display window values (Vs, Is) of the CRT 40 in the embodiment because the desired measurement range is thereby insured. However, the values ($V_L$, $I_L$) may be equal to the values (Vs, Is) if so desired.

Since the voltage limiter 258 and the current limiter 262 are provided on the primary winding side of transformer 16, the ratio of turns on the primary winding to turns on the secondary winding should be considered when setting the limit values. If the voltage limiter and the current limiter were provided on the secondary winding side of the transformer 16, the circuits of the secondary winding side would be more complex in construction and many additional circuits would be required. It is simpler, without sacrifice of accuracy, to limit the voltage $V_L$ and the current $I_L$ by providing the voltage limiter and the current limiter on the primary side of the transformer. As an additional feature, a comparator 230 compares the output voltage from amplifier 256 with the output voltage from amplifier 264 divided by a voltage divider 232. Since the output waveform from the amplifier 256 is undistorted, regardless of the operation of the voltage limiter 258 and the current limiter 262, while the output waveform from the amplifier 264 is distorted by the operation of the limiters, the output level from the comparator 230 drops when the limit mode occurs. The low level output causes a light emitting diode 234 to turn on for informing the operator of limit mode operation.

FIG. 8 is a circuit diagram showing one example of a voltage limiter (voltage control means) 258. A signal line 268 from the variable gain amplifier 256 to the amplifier 260 is connected to the anode of diode 270, an inverting input terminal of amplifier 272, the cathode of diode 274 and an inverting input terminal of amplifier 276. An output terminal of the amplifier 272 is connected to the cathode of diode 270, while an output terminal of the amplifier 276 is connected to the anode of the diode 274. The combination of diode 270 and amplifier 272 limits the voltage on signal line 268 to the voltage at the non-inverting input terminal of amplifier 272. The combination of the diode 274 and amplifier 276 limits the voltage on signal line 268 to a voltage at a non-inverting terminal of the amplifier 276. A switch 278 selects one of a plurality of positive reference voltages from a voltage divider 282 in accordance with the control signal from the control circuit 266 and applies the selected voltage to the non-inverting input terminal of amplifier 272. Similarly, a switch 280 selects one of a plurality of negative reference voltages from a voltage divider 284 in accordance with the control signal from the control circuit 266 and supplies the selected voltage to the non-inverting input terminal of amplifier 276. The amplifiers 272 and 276 may be removed and the diodes 270 and 274 may be directly connected to the switches 278 and 280 if desired. Moreover, an inverter may be connected between the non-inverting input terminal of the amplifier 276 and switch 278 instead of using the switch 280 and the voltage divider 284.

FIG. 9 is a circuit diagram of one example of the current limiter (current control means) 262, and amplifier 264. The output signal from the amplifier 260 is applied to the amplifier 264 through a resistor 285. Amplifier 264 is a push-pull amplifier consisting of a pair of common emitter transistors 290, 292. Since the emitter voltages of the transistors 286 and 288 are substantially constant, a current flowing through resistor 285 is converted into a voltage by amplifier 264 and applied to the primary winding of transformer 16 when transistors 294 and 296 are off. A switch 298 controls a resistance between a voltage source $++V$ and the amplifier 264, and a switch 300 controls the resistance between a voltage source $--V$ and the amplifier 264, in accordance with the control signal from the control circuit 266. When a current larger than a predetermined value flows from ++V to amplifier 264, transistor 294 is turned on and the current flowing through the resistor 285 is shunted into transistor 294 and amplifier 264 so that transformer 16 is prevented from providing a current larger than the predetermined value. Similarly, when a current larger than a predetermined value flows from the amplifier 264 to −−V, transistor 296 is turned on and negative current flowing through resistor 285 is shunted into transistor 296 and amplifier 264 so that transformer 16 is prevented from providing a current less than a predetermined current value (larger than predetermined current in absolute value). Consequently, the current can be limited to a value determined by the selection of switches 298 and 300 by control circuit 266.

FIG. 10 is a circuit diagram of one example of the voltage detector for detecting the voltage across the DUT. This voltage detector is used in block 124 of FIG. 5. This embodiment uses a Kelvin sensing technique to avoid affecting the measurement result by contact resistance when the DUT is connected to the electronic device measurement apparatus. The collector of transistor 26 as the DUT is touched to contacts 358 and 360, and the emitter thereof is touched to contacts 362 and 364. This is accomplished by placing the electrode of the transistor between the two contacts. The contacts 358 and 360 correspond to the first terminal of the DUT, and the contacts 362 and 364 correspond to the second terminal thereof. The contact 358 is connected through the selected load resistor 24 to one electrode of a floating collector supply 321, and the contact 362 is connected through the selected current detecting resistor 32 to the other electrode of the floating collector supply 321. The collector supply 321 may comprise the circuit consisting of the transformer 16 and the selector/rectifier circuit 122 shown in FIG. 5 or the circuit 21 shown in FIG. 1. The contact 362 is grounded to provide the base current path. The voltage divider 36 consisting of resistors 344 and 346 is connected between contact 360 and the collector supply side of resistor 32. The resistors 344 and 346 may be selected by a relay 34 controlled by control circuit 266 in FIG. 7. The dividing ratio of the voltage divider 36 is variable and is defined as n. Thus, R344=(n−1)R346, wherein R344 and R346 represent the values of resistors 344 and 346, respectively.

An output terminal of the voltage divider 36 is connected to an input terminal of a first buffer amplifier 366, the contact 364 is connected to an input terminal of a second buffer amplifier 368, and the collector supply side of the resistor 32 is connected to an input terminal of a third buffer amplifier 370. These buffer amplifiers are, for example, operational amplifiers connected as voltage followers. Since currents flowing through the contacts 360 and 364 are much less than currents flowing through the contacts 358 and 362 because of the high resistance of the voltage divider 36 and the high input impedances of the buffer amplifiers, the voltages across the DUT can be detected without being affected by the contact resistances. An output voltage from the buffer amplifier 366 is divided by resistors 372 and 374 and applied to a non-inverting input terminal of an operational amplifier 376. The output voltages from buffer amplifiers 368 and 370 are applied to an inverting input terminal of amplifier 376 through resistors 378 and 380, respectively. A feedback resistor 382 is inserted between an output terminal and the inverting input terminal of amplifier 376. The resistances of the resistors 378 and 380 are changed by the control circuitry in accordance with the dividing ratio of the voltage divider 36 in the manner described hereinafter. The resistors 372, 374, 378 through 382 and the operational amplifier 376 are termed an operational circuit. Resistors 384 and 386 are inserted between the contacts 358 and 360 and between the contacts 362 and 364, respectively, the values of the resistors 384 and 386 being much larger than the contact resistances. The voltage levels of the contacts 358 and 360 are substantially equal to each other and the voltage levels of the contacts 362 and 364 are substantially equal to each other, even if the DUT is not connected.

A current for the voltage divider 36 flows from the collector supply 321 through the contacts 358 and 360 (a small part of the current flows through resistor 384) and the voltage divider 36 to the collector supply 321. A current for the DUT 26 flows from the collector supply 321 through the contact 358, the DUT 26 (the collector-emitter path of the transistor 26), contact 362 and resistor 32 to the collector supply 321. Thus, the current flowing through the resistor 32 is not affected by the voltage divider 36. Since the current from the bias supply circuit 28 flows through the base-emitter junction of the transistor 26, the contact 362 and ground to the bias supply circuit 28, this current does not flow through resistor 32. Consequently, the current flowing through resistor 32 is only the current flowing between the first and second terminals of the DUT 26, so that the current of the DUT can be detected accurately.

The voltage at the upper terminal of the voltage divider 36 is the voltage at the first terminal of the DUT (the collector of the transistor 26); however, the voltage at the lower terminal of the voltage divider 36 is the voltage at the second terminal of the DUT (the emitter of the transistor 26) offset by the voltage across the contact resistance of the contact 362 and the voltage across resistor 32. Assuming that the voltages at the upper and lower terminals of the voltage divider 36 are respectively $V_C$ and $V_G$ and the voltage at the second terminal of the DUT is $V_E$, the divided output voltage $V_D$ of the voltage divider 36 is as follows:

$$V_D = (V_C - V_G)/n + V_G$$

Since the gains of all the buffer amplifiers 366, 368 and 370 are +1, the output voltage $V_O$ is as follows:

$$V_O = \{R374/(R372 + R374)\}\{R382/(R378//R380) + 1\}V_D$$
$$- (R382/R378)V_E$$
$$- (R382/R380)V_G$$

wherein R372 through R382 represent the values of the resistors 372 through 382, respectively, and R378//R380 represents the parallel resistance of resistors 378 and 380. In the circuit R372=R374=R382, and resistor values are selected or switched by control concurrently with changes in the dividing ratio of divider 36, such that R378=nR372 and R380={n/(n−1)}R372. Therefore the following relationship holds:

$$V_O = (V_C - V_E)/n$$

Thus, the voltage $V_O$ is the voltage between the first and second terminals divided by n. The operational circuit (372-382) compensates for the voltages across the contact and the resistor 32. The buffer amplifier 370 is provided, instead of directly connecting the lower terminal of the resistor 380 to the right side of the resistor 32, so that the current from the power terminal of the buffer amplifier 368 is prevented from flowing through the resistor 32. Therefore, the voltage between the first and second terminals of the DUT and the current flowing through the DUT can be measured accurately with a circuit of simple construction. It should be noted that the buffer amplifiers may be emitter follower amplifiers or voltage follower amplifiers.

While we have shown and described herein the preferred embodiments of our invention, it will be apparent to those skilled in the art that many changes and modifications may be made without departing from our invention in its broader aspects. Therefore, the scope of the present invention should be determined only by the following claims.

We claim:

1. An apparatus for measuring characteristics of electronic divices, comprising:
    generator means for synthesizing a symmetrical alternating voltage in phase with an AC line voltage, said generator means including a variable frequency signal generator, a frequency divider for producing a plurality of divided output signals by dividing an output frequency of said variable frequency signal generator, a phase comparator for comparing one of the divided output signals from said frequency divider with the AC line voltage and controlling an oscillation frequency of said variable frequency signal generator in response to the comparison result, converter means for converting an input signal into the alternating voltage in response to the divider output signals from said frequency divider, and a voltage comparator for comparing a voltage corresponding to the alternating voltage from said converter means with a reference voltage so as to generate the input signal to said converter means;
    voltage supply means for supplying said alternating voltage from said generator means to an electronic device under test;
    voltage detector means for detecting the voltage across said electronic device;
    current detector means for detecting the current flowing through said electronic device; and
    display means for displaying the characteristic of said electronic device in accordance with output signals from said voltage detector means and said current detector means.

2. An apparatus according to claim 1, wherein said converter means includes:
    an encoder for encoding the divided output signals from said frequency divider;
    a multiplexer for connecting selectively an input terminal thereof to one of the output terminals thereof in response to output signals from said encoder, said input terminal receiving the input signal to said converter means;
    a plurality of resistors having first terminals connected to the output terminals of said multiplexer, respectively; and
    an integrator having an input terminal connected to the other terminals of said plurality of resistors.

3. An apparatus according to claim 1, wherein said generator means further includes a peak detector connected between said converter means and said voltage comparator.

4. An apparatus for measuring characteristics of electronic devices, comprising:
    generator means for synthesizing a symmetrical alternating voltage in phase with an AC line voltage;
    voltage supply means for supplying said alternating voltage from said generator means to an electronic device under test, said voltage supply means including a transformer having a primary winding to receive the alternating voltage from said generator means and a secondary winding with a plurality of taps, switch means for selecting one of the plurality of taps of said secondary winding, and a rectifier for rectifying an output signal from said switch means, an output signal from said rectifier being applied to said electronic device;
    voltage detector means for detecting the voltage across said electronic device;
    current detector means for detecting the current flowing through said electronic device; and
    display means for displaying the characteristic of said electronic device in accordance with output signals from said voltage detector means and said current detector means.

5. An apparatus for measuring characteristics of electronic devices, comprising:
    generator means for synthesizing a symmetrical alternating voltage in phase with an AC line voltage;
    voltage supply means for supplying said alternating voltage from said generator means to an electronic device under test;
    voltage detector means for detecting the voltage across said electronic device;
    current detector means for detecting the current flowing through said electronic device, wherein said current detector means includes a current detecting resistor inserted into a current path of said electronic device under test, one terminal of said current detecting resistor being connected to one terminal of said electronic device, and a differential amplifier having two input terminals connected to respective terminals of said current detecting resistor for detecting a voltage across said current detecting resistor; and
    display means for displaying the characteristic of said electronic device in accordance with output signals from said voltage detector means and said current detector means.

6. An apparatus according to claim 5, wherein said voltage detector means includes:
    a voltage divider connected between one terminal of said current detecting resistor adjacent to said voltage supply means and the other terminal of said electronic device;
    a first buffer amplifier having an input terminal connected to an output terminal of said voltage divider;
    a second buffer amplifer having an input terminal connected to one terminal of said electronic device;
    a third buffer amplifier having an input terminal connected to one terminal of said current detecting resistor coupled to said voltage supply means; and
    an operational circuit to receive output signals from said first, second and third buffer amplifiers, an output signal from said operational circuit corresponding to the voltage across said electronic device.

7. An apparatus for measuring characteristics of electronic devices, comprising:
generator means for synthesizing a symmetrical alternating voltage in phase with an AC line voltage;
voltage supply means for supplying said alternating voltage from said generator means to an electronic device under test;
voltage detector means for detecting the voltage across said electronic device;
current detector means for detecting the current flowing through said electronic device; and
display means for displaying the characteristic of said electronic device in accordance with output signals from said voltage detector means and said current detector means;
said apparatus including storage means for storing the output signals from said voltage detector means and said current detector means and applying the stored signals to said display means.

8. An apparatus according to claim 7, wherein said storage means includes:
analog-to-digital converter means for converting the output signals from said voltage detector means and said current detector means to digital signals in response to a clock pulse generated in synchronism with said alternating voltage;
a memory for storing an output signal from said analog-to-digital converter means; and
digital-to-analog converter means for converting the digital signals stored in said memory to analog signals to be applied to said display means.

9. A sine-wave generator for providing a sine-wave voltage, including:
a variable frequency signal generator;
a frequency divider for producing a plurality of divided output signals by dividing an output frequency of said variable frequency signal generator;
connection means for providing AC line voltage;
a phase comparator for comparing one of the divided output signals from said frequency divider with the AC line voltage and controlling an oscillation frequency of said variable frequency signal generator in response to the comparison result;
converter means for converting an input signal into the sine-wave voltage in response to the divided output signals from said frequency divider; and
a voltage comparator for comparing a voltage corresponding to the sine-wave voltage from said converter means with a reference voltage so as to generate the input signal to said converter means.

10. A sine-wave generator according to claim 9, wherein said converter means includes:
an encoder for encoding the divided output signals from said frequency divider;
a multiplexer having input and output terminals, said multiplexer connecting selectively an input terminal thereof to one of the output terminals thereof in response to output signals from said encoder; said input terminal receiving the input signal to said converter means;
a plurality of resistors having first terminals connected to the output terminals of said multiplexer, respectively; and
an integrator having an input terminal connected to the other terminals of said plurality of resistors.

11. A sine-wave generator according to claim 9 further including a peak detector connected between said converter means and said voltage comparator.

12. An apparatus for measuring characteristics of electronic devices, comprising:
voltage supply means for supplying a voltage to an electronic device under test;
a current detecting resistor inserted into a current path of said electronic device under test, one terminal of said current detecting resistor being connected to one terminal of said electronic device;
a differential amplifier having two input terminals connected to terminals of said current detecting resistor for detecting a voltage across said current detecting resistor;
a voltage divider connected between one terminal of said current detecting resistor adjacent to said voltage supply means and the other terminal of said electronic device;
a first buffer amplifier having an input terminal connected to an output terminal of said voltage divider;
a second buffer amplifier having an input terminal connected to one terminal of said electronic device;
a third buffer amplifier having an input terminal connected to one terminal of said current detecting resistor adjacent said voltage supply means;
an operational circuit coupled to receive output signals from said first, second and third buffer amplifiers, an output signal from said operational circuit corresponding to the voltage across said electronic device; and
display means for displaying a characteristic curve of said electronic device in accordance with output signals from said differential amplifier and said operational circuit.

13. An apparatus for measuring characteristics of electronic devices, comprising:
a variable frequency signal generator for generating a signal having a frequency higher than that of an AC line voltage;
a frequency divider for producing a plurality of divided output signals by dividing the output frequency of said variable frequency signal generator;
a phase comparator for comparing one of the divided output signals from said frequency divider with the AC line voltage, an oscillation frequency of said variable frequency signal generator being controlled in response to the comparison result;
a waveform generator for generating an alternating voltage in phase with the AC line voltage in response to the divided output signals from said frequency divider, wherein said waveform generator generates a sine-wave voltage as the alternating voltage;
voltage supply means for supplying the alternating voltage from said waveform generator to an electronic device under test;
voltage detector means for detecting the voltage across said electronic device; and
current detector means for detecting the current flowing through said electronic device.

14. An apparatus according to claim 13 further comprising display means for displaying the characteristic of said electronic device in accordance with output signals from said voltage detector means and said current detector means.

15. An apparatus for measuring characteristics of electronic devices, comprising:
- a variable frequency signal generator for generating a signal having a frequency higher than that of an AC line voltage;
- a frequency divider for producing a plurality of divided output signals by dividing the output frequency of said variable frequency signal generator;
- a phase comparator for comparing one of the divided output signals from said frequency divider with the AC line voltage, an oscillation frequency of said variable frequency signal generator being controlled in response to the comparison result;
- a waveform generator for generating an alternating voltage in phase with the AC line voltage in response to the divided output signals from said frequency divider;
- voltage supply means for supplying the alternating voltage from said waveform generator to an electronic device under test, said voltage supply means including a transformer having a primary winding to receive the alternating voltage from said waveform generator and a secondary winding with a plurality of taps, switch means for selecting one of the plurality of taps of said secondary winding, and a rectifier for rectifying an output signal from said switch means, an output signal from said rectifier being applied to said electronic device;
- voltage detector means for detecting the voltage across said electronic device; and
- current detector means for detecting the current flowing through said electronic device.

16. An apparatus for measuring characteristics of electronic devices, comprising:
- a variable frequency signal generator for generating a signal having a frequency higher than that of an AC line voltage;
- a frequency divider for producing a plurality of divided output signals by dividing the output frequency of said variable frequency signal generator;
- a phase comparator for comparing one of the divided output signals from said frequency divider with the AC line voltage, an oscillation frequency of said variable frequency signal generator being controlled in response to the comparison result;
- a waveform generator for generating an alternating voltage in phase with the AC line voltage in response to the divided output signals from said frequency divider;
- voltage supply means for supplying the alternating voltage from said waveform generator to an electronic device under test;
- voltage detector means for detecting the voltage across said electronic device; and
- current detector means for detecting the current flowing through said electronic device, wherein said current detector means includes a current detecting resistor inserted into a current path of said electronic device under test, one terminal of said current detecting resistor being connected to one terminal of said electronic device, and a differential amplifier having two input terminals connected to respective terminals of said current detecting resistor for detecting a voltage across said current detecting resistor.

17. An apparatus for measuring characteristics of electronic devices, comprising:
- a variable frequency signal generator for generating a signal having a frequency higher than that of an AC line voltage;
- a frequency divider for producing a plurality of divided output signals by dividing the output frequency of said variable frequency signal generator;
- a phase comparator for comparing one of the divided output signals from said frequency divider with the AC line voltage, an oscillation frequency of said variable frequency signal generator being controlled in response to the comparison result;
- a waveform generator for generating an alternating voltage in phase with the AC line voltage in response to the divided output signals from said frequency divider;
- voltage supply means for supplying the alternating voltage from said waveform generator to an electronic device under test;
- voltage detector means for detecting the voltage across said electronic device;
- current detector means for detecting the current flowing through said electronic device;
- analog-to-digital converter means for converting the output signals from said voltage detector means and said current detector means to digital signals in response to a clock pulse generated in synchronism with the alternating voltage; and
- a memory for storing input signals from said analog-to-digital converter means.

18. An apparatus for measuring characteristics of electronic devices, comprising:
- a variable frequency signal generator for generating a signal having a frequency higher than that of an AC line voltage;
- a frequency divider for producing a plurality of divided output signals by dividing the output frequency of said variable frequency signal generator;
- a phase comparator for comparing one of the divided output signals from said frequency divider with the AC line voltage, an oscillation frequency of said variable frequency signal generator being controlled in response to the comparison result;
- a waveform generator for generating an alternating voltage in phase with the AC line voltage in response to the divided output signals from said frequency divider;
- voltage supply means for supplying the alternating voltage from said waveform generator to an electronic device under test;
- voltage detector means for detecting the voltage across said electronic device;
- current detector means for detecting the current flowing through said electronic device;
- display means for displaying the characteristic of said electronic device in accordance with output signals from said voltage detector means and said current detector means;
- analog-to-digital converter means for converting the output signals from said voltage detector means and said current detector means to digital signals in response to a clock pulse generated in synchronism with the alternating voltage;
- a memory for storing output signals from said analog-to-digital converter means; and
- digital-to-analog converter means for converting the digital signals stored in said memory to analog signals to be applied to said display means.

* * * * *

UNITED STATES PATENT AND TRADEMARK OFFICE
CERTIFICATE OF CORRECTION

PATENT NO. : 4,727,318
DATED : February 23, 1988
INVENTOR(S) : Sakai et al

It is certified that error appears in the above-identified patent and that said Letters Patent is hereby corrected as shown below:

Column 4, line 30, "analog-to-the digital" should be --analog-to-digital--.

Column 6, line 44, after ")" insert --,--.

Column 7, line 10, "phase" should be --phases--.

Column 8, line 33, "voltage" should be --voltages--.

Column 11, line 17, "160" should be --260--.

Column 12, line 14, "wavefrom" should be --waveform--.

Column 15, line 22, "divices" should be --devices--.

Column 17, line 61, change ";" to --,--.

Column 20, line 28, "input" should be --output--.

Signed and Sealed this

Twenty-eighth Day of March, 1989

Attest:

DONALD J. QUIGG

Attesting Officer

Commissioner of Patents and Trademarks